(12) United States Patent
Lee

(10) Patent No.: US 9,942,978 B2
(45) Date of Patent: *Apr. 10, 2018

(54) FLEXIBLE DISPLAY DEVICE AND METHOD OF MANUFACTURING THE SAME

(71) Applicant: LG DISPLAY CO., LTD., Seoul (KR)

(72) Inventor: Dal Jae Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/085,710

(22) Filed: Mar. 30, 2016

(65) Prior Publication Data

US 2016/0210894 A1    Jul. 21, 2016

Related U.S. Application Data

(63) Continuation of application No. 14/135,362, filed on Dec. 19, 2013, now Pat. No. 9,326,375.

(30) Foreign Application Priority Data

Apr. 10, 2013   (KR) ................. 10-2013-0039488

(51) Int. Cl.
*H05K 1/02* (2006.01)
*G02F 1/1333* (2006.01)
*G02F 1/1345* (2006.01)
*H05K 3/36* (2006.01)
*H05K 1/18* (2006.01)
(Continued)

(52) U.S. Cl.
CPC .......... *H05K 1/028* (2013.01); *G02F 1/13452* (2013.01); *G02F 1/133305* (2013.01);
(Continued)

(58) Field of Classification Search
CPC ... H05K 1/028; G02F 1/13452; G02F 1/1345; G02F 1/13458; G02F 1/133305
See application file for complete search history.

(56) References Cited

U.S. PATENT DOCUMENTS 4,474,432 A * 10/1984 Takamatsu .......... G02F 1/13452
349/150
5,422,747 A    6/1995 Wakita
(Continued)

FOREIGN PATENT DOCUMENTS

CN    101996535 A    3/2011
CN    102568377 A    7/2012
(Continued)

*Primary Examiner* — Dung Nguyen
(74) *Attorney, Agent, or Firm* — Birch, Stewart, Kolasch & Birch, LLP

(57) ABSTRACT

A flexible display device includes a display panel configured to display images, a first substrate having a plurality of pixels disposed therein, and a second substrate coupled to the first substrate. The first substrate includes a display area, a bent part extending from the display area, and a pad part extending from the bent part. The flexible display device further includes a panel driver coupled to the pad part of the first substrate and configured to supply signals to the plurality of pixels on the display panel for displaying images. The first substrate further includes a first surface and a second surface, and the second substrate includes a third surface and a fourth surface. The first surface of the first substrate faces the fourth surface of the second substrate. The first substrate is curved at the bent part of the first substrate such that the pad part of the first substrate and the panel driver are disposed below the display area.

18 Claims, 3 Drawing Sheets

(51) Int. Cl.
    *G09G 3/20*     (2006.01)
    *H05K 1/11*     (2006.01)

(52) U.S. Cl.
    CPC ... *G09G 3/2096* (2013.01); *G09G 2300/0408* (2013.01); *G09G 2380/02* (2013.01); *H05K 1/111* (2013.01); *H05K 1/189* (2013.01); *H05K 3/361* (2013.01); *H05K 2201/055* (2013.01); *H05K 2201/09063* (2013.01); *H05K 2201/10128* (2013.01); *H05K 2201/10136* (2013.01); *Y10T 29/49126* (2015.01)

(56) References Cited

U.S. PATENT DOCUMENTS

| | | | |
|---|---|---|---|
| 5,436,744 A | * | 7/1995 | Arledge .............. G02F 1/13452 349/150 |
| 6,535,262 B2 | * | 3/2003 | Houdeau ............. G02F 1/13452 349/150 |
| 2009/0213292 A1 | | 8/2009 | Park et al. |
| 2011/0007042 A1 | | 1/2011 | Miyaguchi |
| 2011/0050657 A1 | | 3/2011 | Yamada |
| 2011/0157512 A1 | | 6/2011 | Mishima |
| 2012/0146886 A1 | | 6/2012 | Minami et al. |
| 2014/0183473 A1 | * | 7/2014 | Lee ..................... H01L 51/0097 257/40 |
| 2014/0355227 A1 | * | 12/2014 | Lim ...................... H05K 1/028 361/749 |

FOREIGN PATENT DOCUMENTS

| | | |
|---|---|---|
| CN | 102637386 A | 8/2012 |
| JP | 2011-133752 A | 7/2011 |
| JP | 2013-3171 A | 1/2013 |
| KR | 10-2009-0090547 A | 8/2009 |

* cited by examiner

FLEXIBLE DISPLAY DEVICE AND METHOD OF MANUFACTURING THE SAME

CROSS-REFERENCE TO RELATED APPLICATIONS

This application is a Continuation Application of co-pending U.S. application Ser. No. 14/135,362 filed on Dec. 19, 2013, which claims the benefit of the Korean Patent Application No. 10-2013-0039488 filed on Apr. 10, 2013, all of which are hereby incorporated by reference as if fully set forth herein.

BACKGROUND

Field of the Invention

The present invention relates to a display device, and more particularly, to a flexible display device with a reduced bezel width and a method of manufacturing the same.

Discussion of the Related Art

Generally, in flexible display devices, a plurality of pixels are formed on a thin and flexible substrate such as plastic, and thus, even when the flexible display devices are folded or rolled up as in paper, the flexible display devices can display a desired image. Therefore, the flexible display devices are attracting much attention as the next-generation display devices, and research and development thereof are being done. Examples of such flexible display devices include flexible liquid crystal display devices, flexible plasma display devices, flexible organic light emitting display devices, flexible electrophoretic display devices, flexible electro-wetting display devices, etc.

FIG. 1 is a cross-sectional view schematically illustrating a general flexible display device.

Referring to FIG. 1, the general flexible display device includes a display panel 10 and a panel driver 20. The display panel 10 includes a lower substrate 12 and an upper substrate 14 which face each other and are coupled to each other.

The lower substrate 12 is formed as a thin and flexible substrate with a material such as plastic. The lower substrate 12 includes a display area that includes a plurality of pixels for displaying an image, a peripheral area that surrounds the display area, and a pad part that is provided in a peripheral area of one side of the lower substrate 12.

For example, a plurality of gate lines and a plurality of data lines that define a plurality of pixel areas are formed to intersect each other in the display area, a thin film transistor (TFT) is formed in each area defined by the intersection of a corresponding gate line and data line, and a pixel electrode connected to the corresponding TFT is formed in each of the pixel areas. The pad part is provided in the peripheral area of the one side of the lower substrate 12 to be connected to the gate lines and the data lines, and is connected to the panel driver 20.

The upper substrate 14 is formed as a thin and transparent substrate with a material such as plastic, and is formed to have an area relatively smaller than the area of the lower substrate 12. The upper substrate 14 faces and is coupled to a portion of the lower substrate 12, except for the pad part of the lower substrate 12 by a coupling member (not shown), which is formed in a closed-loop type, in a non-display area of the lower substrate 12.

An optical film (not shown) may be adhered to a top of the upper substrate 14, in which case the optical film may have an anti-reflection function that prevents polarization and/or reflection of external light.

The panel driver 20 is connected to the pad part of the lower substrate 12, and supplies signals to the gate lines and data lines. To this end, the panel driver 20 may include a flexible circuit board 21, a driving integrated circuit (IC) 23, a control board 25, and a driving circuit part 27.

The flexible circuit board 21 is adhered to the pad part of the lower substrate 12, and bent to be positioned below a bottom area of the lower substrate 12 to surround a side surface of the lower substrate 12.

The driving IC 23 is mounted on the flexible circuit board 21. The driving IC 23 generates data signals and a pixel driving signal for displaying an image on the display panel 10 on the basis of image data and a timing sync signal which are supplied from the control board 25, and supplies the data signals and the pixel driving signal to the pad part.

The control board 25 is adhered to the flexible circuit board 21, and is disposed below the lower substrate 21. The control board 25 is connected to another control board (not shown) that generates image data and the timing sync signal which correspond to an image to be displayed by the display panel 10, and transfers the image data and timing sync signal, which are supplied from the other control board, to the driving IC 23 through the flexible circuit board 21.

The driving circuit board 27 is mounted on the control board 25, and includes passive elements, such as a resistor, a capacitor, and an inductor, and/or an IC. The driving circuit board 27 generates a voltage necessary to drive the display panel 10 and/or the driving IC 23.

The related art flexible display device drives the pixels of the display panel 10 according to a driving of the panel driver 20, thereby displaying a desired image on the display panel 10.

However, in the related art flexible display device of FIG. 1, the panel driver 20 (more specifically, the flexible circuit board 21) is bent to surround a side surface of the lower substrate 12. Therefore, since a portion of the flexible circuit board 21 and a bending part 21a of the flexible circuit board 21 are disposed outside the side surface of the display panel 10, a bezel width W of the related art flexible display device increases due to one side of the lower substrate 12, the portion of the flexible circuit board 21, and the bending part 21a.

Moreover, the related art flexible display device has an increased number of elements therein due to the presence of the flexible circuit board 21 and the control board 25, which also causes an increase in the manufacturing cost. Also, a yield rate of the related art flexible display device can be reduced by a bonding defect which is caused by the bonding process of adhering the flexible circuit board 21 to the lower substrate 12 and the bonding process of adhering the control board 25 to the flexible circuit board 21.

SUMMARY

Accordingly, the present invention is directed to providing a flexible display device and a method of manufacturing the same that substantially obviate one or more problems due to limitations and disadvantages of the related art.

An aspect of the present invention is directed to providing a flexible display device with a reduced bezel width and a method of manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided according to an embodiment a flexible display device including: a display panel configured to include a first substrate, which includes a plurality of pixels and in which a bending part is provided at one side distal end of the first substrate, and a second substrate facing and coupled to the first substrate; a panel driver connected to a distal end of the bending part, and configured to supply signals to the respective pixels; and a supporting member configured to support the first substrate, and include a side surface which faces the bending part and is rounded to guide a bending of the bending part.

In another aspect of the present invention, there is provided according to an embodiment a method of manufacturing a flexible display device, including: manufacturing a display panel by coupling a first substrate, which includes a plurality of pixels and in which a bending part is provided at one side distal end of the first substrate, to a second substrate; manufacturing a supporting member that includes a side surface rounded by a hemming process; adhering the supporting member to a bottom of the display panel; bending the bending part along the side surface; and closely adhering a distal end of the bending part to a bottom of the supporting member.

According to an embodiment, the present invention provides a flexible display device including a display panel configured to display images, and including a flexible first substrate having a plurality of pixels disposed therein and a second substrate coupled to the flexible first substrate, the flexible first substrate including a display area, a bent part extending from the display area, and a pad part extending from the bent part; a panel driver connected to the pad part, and configured to supply signals to the respective pixels; and a supporting member configured to support the flexible first substrate, and including a bent part for guiding the bent part of the first substrate.

According to an embodiment, the present invention provides a method of manufacturing a flexible display device, the method including manufacturing a display panel by coupling a flexible first substrate to a second substrate, the flexible first substrate including a display area having a plurality of pixels, a to-be-bent part extending from the display area, and a pad part extending from the to-be-bent part; adhering a panel driver to the pad part, the panel driver configured to supply signals to the respective pixels; manufacturing a supporting member including a bent part formed by a hemming process; adhering the supporting member to a bottom of the display panel; bending the to-be-bent part of the flexible first substrate along the bent part of the supporting member, so as to form a bent part of the flexible first substrate; and adhering at least one of the pad part and the panel driver to a bottom of the supporting member.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts. Further, any one or more features and/or elements from one or more embodiments of the present invention described herein can be applied or combined to any one or more embodiments of the present invention described herein. Further, one or more elements from one or more embodiments of the present invention can substitute one or more elements in another embodiment of the present invention.

Hereinafter, a flexible display device and a method of manufacturing the same according to embodiments of the present invention will be described in detail with reference to the accompanying drawings.

Figure 1:
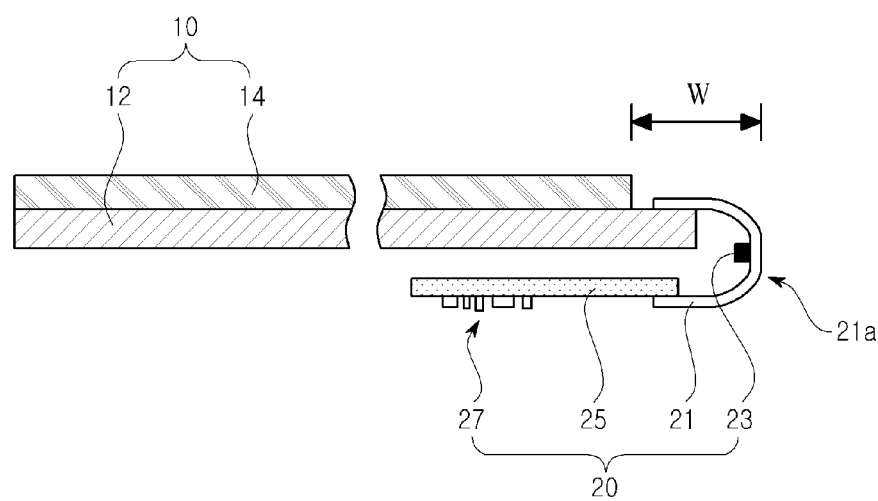
FIG. 1 is a cross-sectional view schematically illustrating a general flexible display device according to a related art.
Figure 2:
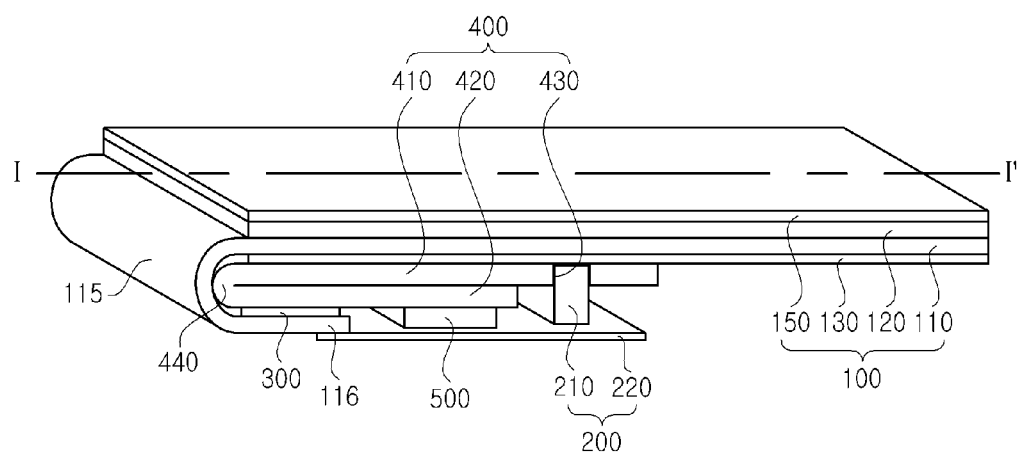
FIG. 2 is a perspective view illustrating a flexible display device according to an embodiment of the present invention.
Figure 3:
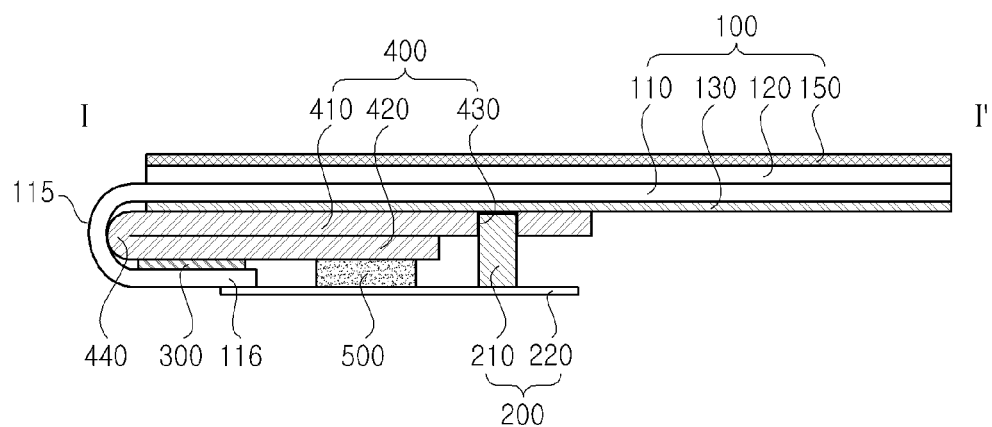
FIG. 3 is a cross-sectional view of the flexible display device illustrating a view taken along a line I-I' of FIG. 2 according to an embodiment of the present invention.

FIG. 2 is a perspective view illustrating a flexible display device according to an embodiment of the present invention. FIG. 3 is a cross-sectional view of the flexible display device according to an embodiment of the present invention, and is a cross-sectional view illustrating a view taken along a line I-I' of FIG. 2.

The flexible display device according to an embodiment of the present invention, as illustrated in FIGS. 2 and 3, includes: a display panel 100 that includes a first substrate 110, which includes a plurality of pixels and in which a bending part 115 is provided at one side distal end of the first substrate 110, and a second substrate 120 facing and coupled to the first substrate 110; a panel driver 200 that is connected to a distal end of the bending part 115 of the first substrate 110, and supplies signals to the plurality of pixels; and a supporting member 400 that supports the first substrate 110, and includes a side surface which faces the bending part 115 and is rounded to guide a bending in the bending part 115. The flexible display device of the present invention can include additional components, and all the components of the flexible display device of the present invention are operatively coupled and configured. Further the flexible display device of the present invention can be any type of a flexible display device such as a flexible liquid crystal display device, a flexible plasma display device, a flexible organic light emitting display device, a flexible electrophoretic display device, a flexible electro-wetting display device, etc.

First, the display panel 100 will now be described.

The display panel 100 may be a flexible flat panel display device. In the following description, it is assumed that the display panel 100 is an organic light emitting display panel applied to a flexible organic light emitting display device that is a type of flexible flat panel display device; however, the display panel 100 can be of a different type. The display panel 100 includes the first and second substrates 110 and 120 which are facing each other and coupled to each other, a back plate 130 that is provided at a bottom of the first substrate 110, and an optical film 150 that is formed at a top of the second substrate 120.

First, the first substrate 110 is a flexible thin film substrate, and may be formed of a plastic material or a metal foil. That is, the first substrate 110 is formed of a flexible material, and thus, as illustrated in FIGS. 2 and 3, the first substrate 110 can be bent.

For example, the first substrate 110 formed of the plastic material may be formed of one or more of polyimide (PI), polycarbonate (PC), polynorborneen (PNB), polyethyleneterephthalate (PET), polyethylenapthanate (PEN), and polyethersulfone (PES). The first substrate 110 includes a display part, a non-display part, the bending part 115, and a pad part 116.

The display part of the first substrate 110 includes a plurality of gate lines, a plurality of data lines, a plurality of driving power lines, the plurality of pixels, and a cathode power line. The plurality of gate lines are arranged at certain intervals to intersect the plurality of data lines, and the plurality of driving power lines are arranged in parallel to the plurality of gate lines or the plurality of data lines.

The plurality of pixels are respectively formed in a plurality of pixel areas defined by the intersections between the plurality of gate lines and the plurality of data lines, and display an image according to a gate signal from the gate lines and data signals from the respective data lines. To this end, each of the plurality of pixels includes a pixel driving circuit connected to a corresponding gate line and data line and an organic light emitting element connected to the pixel driving circuit and the cathode power line.

Each pixel driving circuit includes a switching transistor connected to a corresponding gate line and data line, a driving transistor connected to the switching transistor, and a capacitor connected to a gate and source of the driving transistor.

Each pixel driving circuit supplies a data signal, supplied to the corresponding data line through the switching transistor which is turned on according to the gate signal supplied through the corresponding gate line, to the driving transistor to store a gate-source voltage of the driving transistor corresponding to the data signal in the capacitor.

Each driving transistor is turned on with the voltage stored in the capacitor, and supplies a data current corresponding to the data signal to the organic light emitting element. Here, each of the transistors may be an a-Si thin film transistor (TFT), a poly-Si TFT, an oxide TFT, or an organic TFT.

Each pixel driving circuit may further include at least one compensation transistor and at least one compensation capacitor that compensate for a threshold voltage of the driving transistor.

Each organic light emitting element includes a pixel electrode (or an anode electrode) connected to the driving transistor, an organic emitting layer formed on the pixel electrode, and a cathode electrode formed on the organic emitting layer. Each organic light emitting element emits light with a data current which flows from the pixel electrode to the cathode electrode according to the driving transistor being turned on, and emits light of luminance, corresponding to the data current, to on the second substrate 120.

The cathode power line may be provided at the entire surface of the display part of the first substrate 110 to be electrically connected to the cathode electrode of each pixel, or provided in the form of patterns to be electrically connected to the respective cathode electrodes of a plurality of pixels formed on a vertical line or horizontal line of the display part. The cathode power line may be provided to be electrically connected to the organic emitting layer of each pixel, in which case the cathode electrode is not provided.

The non-display part of the first substrate 110 is provided as a peripheral area of the display part to surround the display part of the first substrate 110. Here, the non-display part may be defined as an area overlapping an edge portion of the second substrate 120.

A plurality of link lines, electrically connected to the plurality of gate lines, the plurality of data lines, the plurality of driving power lines, and the cathode power line which are provided in the display part, are provided at one side of the non-display part of the first substrate 110.

The bending part 115 of the first substrate 110 extends from the one side of the non-display part of the first substrate 110 to have a certain area, and is bent in a bottom direction of the first substrate 110. That is, the bending part 115 of the first substrate 110 can be bent by a substrate bending apparatus to have a certain curvature, and overlaps a lower portion of one side of the second substrate 120. A plurality of extension lines electrically connected to the respective link lines are provided at the bending part 115.

The pad part 116 of the first substrate 110 is electrically connected to a flexible circuit board 220 of the panel driver 200.

However, the pad part 116 may be electrically connected to the driving integrated circuit (IC) 210 of the panel driver 200. That is, in FIGS. 2 and 3, the flexible circuit board 220 is electrically connected to the pad part 116, and the driving IC 210 is mounted on the flexible circuit board 220. However, the present invention is not limited thereto.

For example, the driving IC 210 may be mounted directly on the pad part 116 that is provided at the first substrate 110. In this case, the pad part 116 is directly and electrically connected to the driving IC 210 instead of the flexible circuit board 220.

Second, the second substrate 120 of the display panel 100 is formed of a transparent plastic material, and formed to have an area relatively smaller than the first substrate 110. The second substrate 120 is facing and coupled to the first substrate 100 including an inner portion of the bending part 115 of the first substrate 110 by a coupling member which is formed in a closed-loop type at the non-display part of the first substrate 110.

The coupling member couples the first substrate 110 and the second substrate 120 with each other, and seals a space between the first and second substrates 110 and 120 for protecting the organic light emitting elements against external moisture, oxygen, dusts, etc. That is, the second substrate 120 may perform a function of an encapsulating substrate (an encap) that seals the first substrate 110.

Third, the back plate 130 of the display panel 100 is provided at the bottom of the first substrate 110, prevents a foreign material from being adhered to the bottom of the first substrate 110, and prevents light, emitted from the display part 112 of the first substrate 110, from traveling in a lower direction of the first substrate 110.

The first substrate 110 undergoes a process of forming the pixel driving circuit in a state where the first substrate 110 is mounted on a main substrate such as a glass substrate, coupled to the second substrate 110, and separated from the main substrate. In this case, adhesive materials which were adhered to the main substrate remain at the bottom of the first substrate 110, and due to the adhesive materials, a foreign material can be adhered to the first substrate 110. To prevent or minimize such foreign materials, the back plate 130 is adhered to the outer bottom surface of the first substrate 110 separated from the main substrate. The back plate 130 may be provided in a plate shape such as plastic, or in a film shape.

Fourth, the optical film 150 of the display panel 100 is formed to have an anti-reflection function that prevents polarization and/or reflection of external light, and is adhered to an outer top surface of the second substrate 120. As a variation, the optical film 150 may not be provided, or multiple optical films or variations thereof may be provided.

Next, the panel driver 200 of the flexible display device according to an embodiment of the present invention will now be described.

The panel driver 200 may be configured with the flexible circuit board 220 and the driving IC 210.

First, the flexible circuit board 220 may use a chip-on film (COF) or a flexible printed circuit (FPC), and the driving IC 210 that supplies a control signal and a driving signal (hereinafter simply referred to as a signal) for emitting light from the pixels of the display panel 100 is provided at the flexible circuit board 220.

One side of the flexible circuit board 220 is directly and electrically connected to the pad part 116 of the first substrate 110.

Second, the driving IC 210 can be mounted on the flexible circuit board 220 by a chip bonding process, a surface mounting process, or other suitable processes, and bonded to a plurality of signal supply terminals and a plurality of signal input terminals.

The driving IC 210 generates data signals and gate signals on the basis of video data and a timing sync signal which are supplied from the outside through the plurality of signal input terminals, and supplies the generated data signals and gate signals to the corresponding signal supply terminals to drive the respective pixels formed in the display part of the first substrate 110, thereby displaying an image corresponding to the video data on the display part.

However, the panel driver 200 is not limited to the above-described configuration. That is, the panel driver 200 may be configured in various ways. For instance, the panel driver 200 according to the first embodiment, as described above, may include the flexible circuit board 220 and the driving IC 210.

The panel driver 200 according to a second embodiment may include only the driving IC 210 (but not the flexible circuit board 220). That is, the flexible circuit board 220 may be directly and/or electrically connected to the pad part 116, and thus, the driving IC 210 may be electrically connected to the first substrate 110, or directly connected to the pad part 116 that is provided at the first substrate 110. In this case, the panel driver 200 may be configured with only the driving IC 210.

The panel driver 200 according to a third embodiment may include the flexible circuit board 220, the driving IC 210, and a plurality of driving elements that are disposed at the flexible circuit board 220 so as to supply image data and a timing sync signal, which are input from an external control board, to the driving IC 210.

The panel driver 200 according to a fourth embodiment may include the flexible circuit board 220, the driving IC 210 disposed at the flexible circuit board 220, a driving circuit board electrically connected to the flexible circuit board, and the plurality of driving elements disposed at the driving circuit board.

In addition to the above-described embodiments, the panel driver 200 may be configured in other various ways.

Finally, the supporting member 400 of the flexible display device according to an embodiment of the present invention will now be described.

First, the supporting member 400 is formed by a hemming process. That is, as illustrated in FIGS. 2 and 3, the supporting member 400 is formed in order for a bent portion of the supporting member 400 to be rounded by a process of bending one end of a bendable synthetic resin or a metal material such as stainless.

Second, the supporting member 400 includes: a first supporting part 410 that is adhered to the bottom of the display panel 100 (e.g., to the outer surface of the back plate 130); a hemming part 440 that extends from the first supporting part 410 to be rounded, and faces the bending part 115; and a second supporting part 420 that extends from the hemming part 440, and is closely adhered to a bottom of the first supporting part 410.

In the supporting member 400, the hemming part 440 that faces the bending part 115 provided at the first substrate 110 is formed to be rounded.

When the supporting member 400 is formed of a metal material, the supporting member 400 may perform a heat dissipating function that dissipates heat generated from the display panel 100.

Third, the driving IC hole 430 (FIG. 4) into which the driving IC 210 configuring the panel driver 200 is inserted is formed at the supporting member 400. In particular, the driving IC hole 430 may be formed at the first supporting part 410. For instance, in order to prevent the driving IC 210 from being formed directly on the first supporting member 410 when the panel driver 200 is closely adhered to the bottom area of the supporting member 400, the driving IC hole 430 into which the driving IC 210 is inserted is formed at the first supporting part 410.

However, as a variation, the driving IC hole 430 may be formed only at the second supporting part 420. For instance, the length (L in FIG. 4) of the second supporting part 420 can be greater than that of the first supporting part 410, such that the driving IC hole 430 is formed only at the second supporting part 420, and the driving IC 210 is inserted into the driving IC hole 430 of the second supporting part 420 (but not through the first supporting part 410).

In another variation, the driving IC hole 430 may be formed at both the first and second supporting parts 410 and 420. For instance, the second supporting part 420 can be formed to have the length L equal to (or substantially equal to) the first supporting part 410, and thus, when the driving IC 210 is closely adhered to the first and second supporting parts 410 and 420, the driving IC hole 430 may be formed at the first and second supporting parts 410 and 420.

Fourth, in FIGS. 2 and 3, the length (L direction in FIG. 4) of the second supporting part 420, namely, a length from the hemming part 440 to a distal end of the second supporting part 420 facing the hemming part 440, is less than that of the first supporting part 410, but the present invention is not limited thereto. Therefore, the length of the second supporting part 420 may be equal to or greater than that of the first supporting part 410 as discussed above.

The width (W in FIG. 4) of the supporting member 400 is substantially uniform. However, if desired, at least one of the first and second supporting parts 410 and 420 and the bending part 115 can have a varying width or shape.

In FIGS. 2 and 3, the first supporting part 410 is illustrated as supporting only a portion of the bottom of the display panel 100, but the present invention is not limited thereto. For instance, the first supporting part 410 may be formed to have a size capable of supporting the entire bottom of the display panel 100.

In addition to the driving IC hole 430, at least one or more driving element holes (not shown) into which various driving elements included in the panel driver 200 can be positioned, may be formed at the first supporting part 410 and/or the second supporting part 420.

Since a height of each of the driving IC 210 and/or the driving elements is greater than a height of the space between the flexible circuit board 220 and the supporting member 400, the driving IC hole 430 and/or the driving element holes prevent the driving IC 210 and/or the driving elements from being formed directly on the supporting member 400.

Fifth, the panel driver 200 may be adhered and fixed to the bottom of the supporting member 400 by an adhesive member/material.

For example, when the panel driver 200 is configured with the flexible circuit board 220 (which is connected to the pad part 116 extending from the bending part 115) and the driving IC 210 mounted on the flexible circuit board 220, the flexible circuit boar 220 and the pad part 116 provided at the first substrate 110 may be adhered to the bottom of the supporting member 400 by the adhesive member.

In this case, the adhesive member can include a first adhesive member 300, which is adhered to the pad part 116 and disposed between the pad part 116 and the supporting member 400, and a second adhesive member 500 that is adhered to the flexible circuit board 220 in a state where the second adhesive member 500 is adhered to the bottom of the supporting member 400.

Each of the first and second adhesive members 300 and 500 may be formed of plastic having a plate shape, or formed of one or more various materials having a cushion. The various materials having a cushion, for example, may include latex, sponge, urethane foam that is a foam resin, EVA, silicon, and tape having a cushion.

The first adhesive member 300 and/or second adhesive member 500 formed of a material having a cushion absorbs an impact applied to the pad part 116, the flexible circuit board 220, and/or the diving IC 210.

When the bending part 115 provided at the first substrate 110 is guided by the hemming part 440 provided at the supporting member 400 and is bent, the first adhesive member 300 is adhered to the pad part 116 so as to closely adhere the pad part 116 to the bottom of the second supporting part 410 near the hemming part 440 of the supporting member 400.

In this case, the first adhesive member 300 may also be adhered to the bottom of the supporting member 400. However, when the first adhesive member 300 is bent less than the second adhesive member 500 because the first adhesive member 300 is formed of a stiffer material than the second adhesive member 500, for example, when the first adhesive member 300 is formed of plastic having a plate shape, the first adhesive member 300 may be adhered to only the pad part 116. That is, since the pad part 116 maintains a plane due to the first adhesive member 300 having a plate shape, only the flexible circuit board 220 may be adhered to the bottom of the supporting member 400 without the first adhesive member 300 being adhered to the bottom of the supporting member 400.

The first adhesive member 300 can prevent the pad part 116 of the first substrate 110 from being damaged by the bottom portion of the supporting member 400. That is, since the first substrate 110 is formed of a thin film, the first substrate 110 can be damaged even by a fine protrusion portion which is formed at the bottom of the supporting member 400. Therefore, the first adhesive member 300 is inserted between the outer bottom surface of the supporting member 400 and the inner surface of the pad part 116 of the first substrate 110, thus preventing or minimizing this damage.

As another example, if the driving IC 210 is directly disposed on the pad part 116 of the first substrate 110, the pad part 116 may be adhered to the bottom of the supporting member 400 by only one of the first and second adhesive members 300 and 500. In this case, the driving IC 210 configuring the panel driver 200 may be closely adhered and fixed to the bottom of the supporting member 400 according to the pad part 116 being adhered to the supporting member 400 by the adhesive member.

Figure 4:
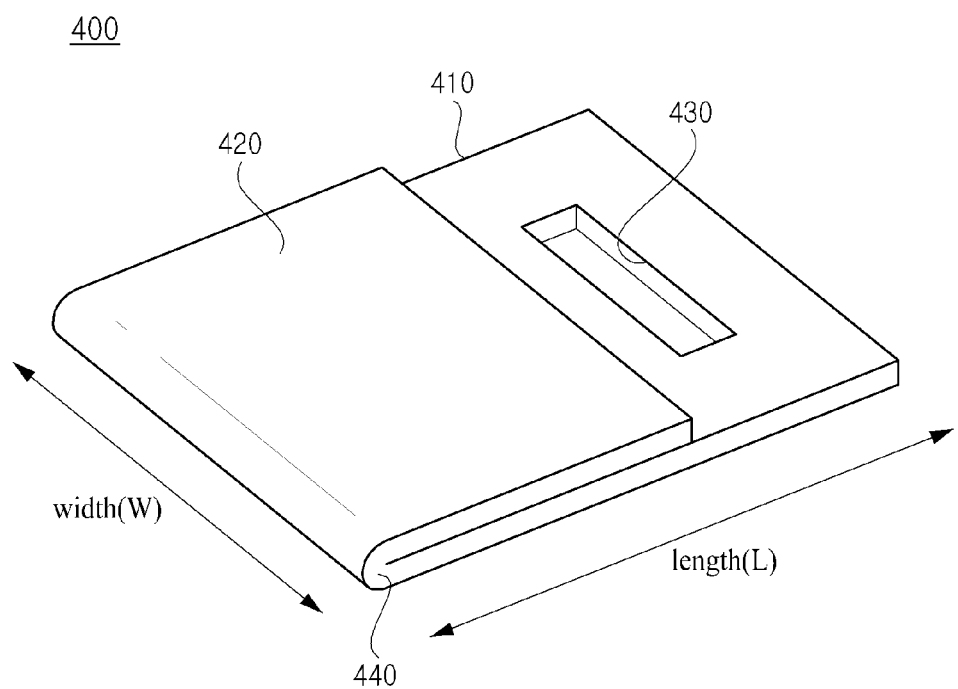
FIG. 4 is a perspective view illustrating a supporting member applied to the flexible display device according to an embodiment of the present invention.
Figure 5:
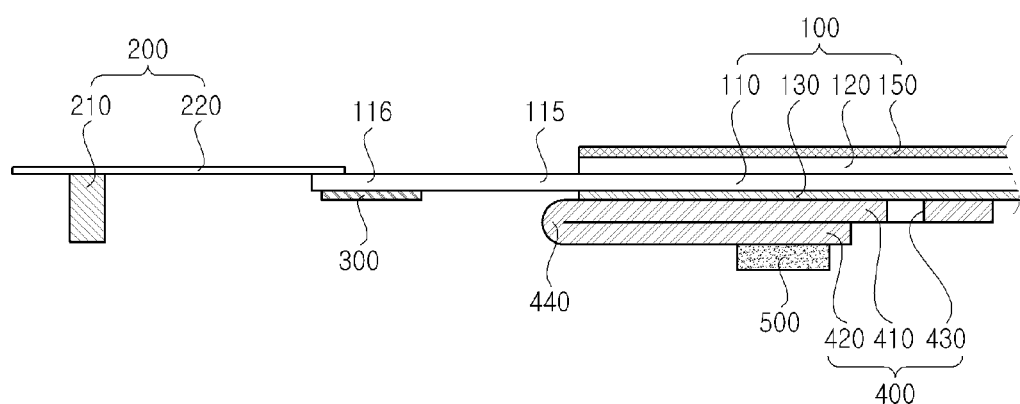
FIG. 5 is a cross-sectional view illustrating a state in which a bending part is not bent in the flexible display device according to an embodiment of the present invention.
Figure 6:
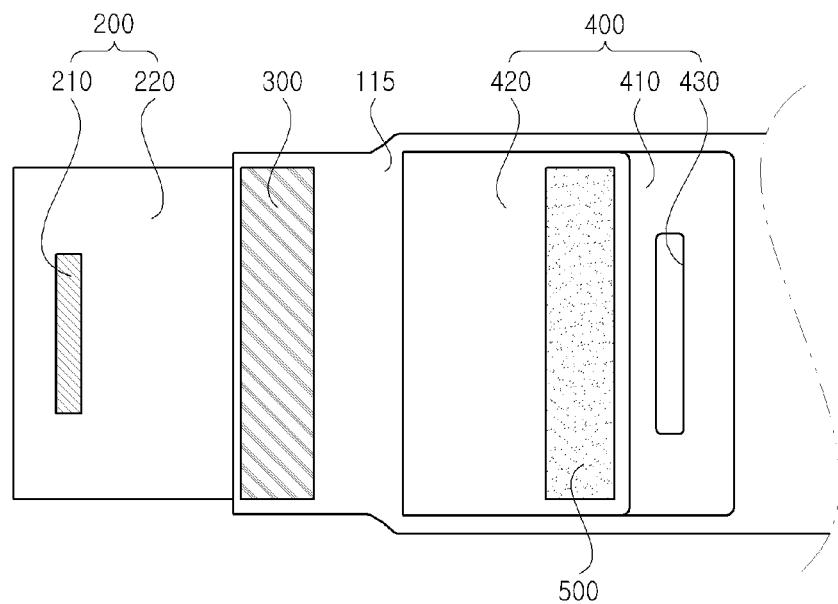
FIG. 6 is a bottom view of the flexible display device of FIG. 5, which illustrates the state in which the bending part is not bent in the flexible display device according to an embodiment of the present invention.

FIG. 4 is a perspective view illustrating a supporting member applied to a flexible display device according to an embodiment of the present invention, FIG. 5 is a cross-sectional view illustrating a state in which a bending part of the first substrate of the display panel is not bent in the flexible display device according to an embodiment of the present invention, and FIG. 6 is a bottom view illustrating the state in which the bending part is not bent in the flexible display device according to an embodiment of the present invention. More specifically, FIG. 4 illustrates an example of the supporting member 400 of FIGS. 2 and 3, FIG. 5 illustrates the cross-sectional view shown in FIG. 3 in a state where the bending part 115 is not bent, and FIG. 6 is a bottom view of the flexible display device shown in FIG. 5.

A method of manufacturing the flexible display device according to an embodiment of the present invention will now be described referring to FIGS. 5 and 6. The flexible display device here preferably is the flexible display device of FIGS. 2-4; however, the method of the present invention can be equally applied to manufacture other flexible display devices according to the present invention.

As shown in FIGS. 5 and 6, first, the display panel 100 is manufacture by coupling the first substrate 110, which includes the plurality of pixels and in which the bending part 115 is provided at one side distal end of the first substrate 110, to the second substrate 120. Here, the first substrate 110 extends beyond the end of the second substrate 120.

The panel driver 200 is mounted on the pad part 116 extending from the bending part 115 of the first substrate 110. When the panel driver 200 is configured with the flexible circuit board 220 and the driving IC 210, the flexible circuit board 220 is connected to the pad part 116, and the driving IC 210 is disposed at the flexible circuit board 220.

However, as described above, in a variation, the driving IC 210 may be directly disposed at the pad part 116.

Then, the first adhesive member 300 is adhered to a portion of the pad part 116 in which the flexible circuit board 220 or the driving IC 210 is not disposed. As described above, when the first adhesive member 300 is formed of a plastic material to have a plate shape, the first adhesive member 300 may be adhered to only the pad part 116. In this case, since the first adhesive member 300 may have only one side that has adhesive properties, even when the pad part 116 is later moved (after the hemming part 440 is formed as described below) and positioned below the bottom of the supporting member 400, the first adhesive member 300 may not adhere to the outer bottom surface of the supporting member 400.

However, as variation, if the first adhesive member 300 has two opposite sides that have adhesive properties, then in a state where one side of the first adhesive member 300 is adhered to the pad part 116, when the pad part 116 is later moved (after the hemming part 440 is formed as described below) and positioned below the bottom surface of the supporting member 400, the other side of the first adhesive member 300 may be adhered to the bottom surface of the supporting member 400.

As a variation, one side of the first adhesive member 300 can be first disposed or attached to the outer bottom surface of the supporting member 400 having the hemming part 440 as shown in FIG. 5. When the pad part 116 shown in FIG. 5 is later moved (after the hemming part 440 is formed as described below) and positioned below the bottom surface of the supporting member 400, then the other side of the first adhesive member 300 may be adhered to the inner surface of the pad part 116.

The formation of the supporting member 400 having a side surface (the hemming part 440) rounded by the hemming process will now be described. The hemming process denotes a process of rounding a bent portion.

The supporting member 400, as illustrated in FIG. 4, includes the first supporting part 410, the second supporting part 420, and the hemming part 440 formed due to the hemming process. The driving IC hole 430 may be formed before the hemming process, or may be formed after the hemming process.

The driving IC hole 430 may be formed at the supporting member 400 by a punching process.

Subsequently, as illustrated in FIGS. 5 and 6, the supporting member 400 having the hemming part 440 (bent portion) is adhered to the bottom of the display panel 100. For instance, the supporting member 400 may be adhered to the outer surface of the back plate 130 of the display panel 100.out In this case, as described above, the first adhesive member 300 may be adhered to the pad part 116, the flexible circuit board 220 with the driving IC 210 disposed therein may be adhered to the pad part 116, and the second adhesive member 500 may be adhered to the outer bottom surface of the second supporting part 420 of the supporting member 400.

In a variation, instead of attaching the second adhesive member 500 to the supporting member 400 as shown in FIG. 5, the second adhesive member 500 may be first adhered to the flexible circuit board 220, so that when the bending part 115 of FIG. 5 is bent, the second adhesive member 500 then can adhere to the outer bottom surface of the second supporting part 420 of the supporting member 400.

In one example, the supporting member 400 having the hemming part 440 may be fixed to the back plate 130 before, after, or at the same time as, the first adhesive member 300 and/or the panel driver 200 is connected to the pad part 116.

Subsequently, the un-bent bending part 115 is bent along the hemming part 440 provided at the side surface of the supporting member 400.

The hemming part 440 is formed to be rounded, and thus, when the bending part 115 is bent, the bending part 115 is formed to be rounded. As a result, as illustrated in FIGS. 2 and 3, the rounded portion of the bending part 115 is closely positioned adjacent to the hemming part 440 of the supporting member 400, and the pad part 116 is closely adhered to the bottom of the supporting member 400.

In these examples firs, the pad part 116 extending from the bending part 115 may be adhered to the bottom of the supporting member 400 by the first adhesive member 300, or may be disposed to be closely positioned adjacent to the bottom of the supporting member 400 without the presence of the first adhesive member 300.

Moreover, when the first adhesive member 300 is adhered to the pad part 116 extending from the bending part 115, the flexible circuit board 220 connected to the pad part 116 is adhered to the bottom of the supporting member 400 by using the second adhesive member 500, and thus, the distal end of the bending part 115 is closely adhered to the bottom of the supporting member 400.

According to the embodiments of the present invention, the bending part of the first substrate configuring the display panel is directly bent towards a bottom direction of the display panel, and the pad part extending from the bending part is disposed at the bottom of the display panel, thus decreasing the bezel width of the display panel.

Moreover, according to the embodiments of the present invention, due to the rounded side surface of the supporting member disposed at the bottom of the display panel, the bending part of the first substrate is naturally folded with the bending part having a curved surface, and thus, the plurality of circuits provided at the bending part can be prevented from being damaged. As a result, the supporting member having the hemming part (rounded part) protects and secures the circuits connected to the bending part of the first substrate as the bending part is curved along the contours of the hemming part, which in turn decreases the bezel width of the entire display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible display device comprising:
   a display panel configured to display images, and including a first substrate having a plurality of pixels disposed therein, the first substrate having a display area, a bent part disposed adjacent to the display area, and a pad part extending from the bent part;
   a second substrate coupled to the first substrate;
   a back plate provided at a bottom of the first substrate;
   a supporting member adhered to the back plate and to the pad part or the bent part of the first substrate; and
   a first driver including a flexible circuit board and at least one driving IC disposed at the flexible circuit board that is electrically connected to the pad part of the first substrate, and configured to supply signals to the display panel,
   wherein the pad part of the first substrate and the first driver are disposed below the display area of the first substrate and the supporting member,
   wherein the first substrate includes a first surface and a second surface, and the second substrate includes a third surface and a fourth surface,
   wherein the first surface of the first substrate faces the fourth surface of the second substrate, and
   wherein the first driver faces the second surface of the first substrate in the display area.

2. The flexible display device of claim 1, wherein the supporting member includes a driving IC hole into which the at least one driving IC of the first driver is inserted.

3. The flexible display device of claim 2, wherein the supporting member includes:
- a first supporting part adhered to the display area of the first substrate;
- a bent part extending from the first supporting part and being curved to face the bent part of the first substrate; and
- a second supporting part extending from the bent part of the supporting member, and facing a bottom of the first supporting part.

4. The flexible display device of claim 3, wherein the driving IC hole is formed at one of the first and second supporting parts.

5. The flexible display device of claim 3, wherein the driving IC hole is formed at the second supporting part.

6. The flexible display device of claim 1, wherein at least one of the pad part of the first substrate and the flexible circuit board of the first driver is adhered to the supporting member by at least one adhesive member, the supporting member being disposed on the second surface of the first substrate to support the display area of the first substrate.

7. The flexible display device of claim 6, wherein the supporting member includes a bent part for guiding the bent part of the first substrate.

8. The flexible display device of claim 7, wherein the first substrate wraps the bent part of the supporting member.

9. The flexible display device of claim 6, wherein the at least one adhesive member includes:
- a first adhesive member adhered to at least one of the pad part and the supporting member; and
- a second adhesive member adhered to at least one of the supporting member and the flexible circuit board.

10. The flexible display device of claim 9, wherein the first adhesive member includes a material that is less flexible than a material of the second adhesive member.

11. The flexible display device of claim 1, wherein the supporting member is made of a bendable synthetic resin or metal material.

12. The flexible display device of claim 1, wherein the first substrate in the display area has a first width, and the first substrate in the bent part has a second width smaller than the first width.

13. A flexible display device comprising:
- a display panel including a substrate, the substrate having a display area including a plurality of pixels to display images, a bent part disposed adjacent to the display area, and a pad part extending from the bent part;
- a panel driver including at least one driving IC disposed at a flexible circuit board that is electrically connected to the pad part of the substrate to supply signals to the display panel; and
- a supporting member disposed below the display area and adhered to the pad part or the bent part of the substrate,
- wherein the substrate including first and second surfaces is curved at the bent part of the substrate such that the pad part of the substrate and the panel driver are disposed below the display area and the supporting member, and
- wherein the panel driver faces the second surface of the substrate in the display area.

14. The flexible display device of claim 13, wherein the substrate in the display area has a first width, and the substrate in the bent part has a second width smaller than the first width.

15. The flexible display device of claim 13, wherein at least one of the pad part of the substrate and the flexible circuit board of the panel driver is adhered to the supporting member by at least one adhesive member.

16. The flexible display device of claim 15, wherein the at least one adhesive member includes:
- a first adhesive member adhered to at least one of the pad part and the supporting member; and
- a second adhesive member adhered to at least one of the supporting member and the flexible circuit board.

17. The flexible display device of claim 13, wherein the supporting member includes a bent part for guiding the bent part of the substrate.

18. The flexible display device of claim 13, wherein the supporting member includes:
- a first supporting part adhered to the display area of the substrate;
- a bent part extending from the first supporting part and being curved to face the bent part of the substrate; and
- a second supporting part extending from the bent part of the supporting member, and facing a bottom of the first supporting part.

* * * * *